United States Patent
Basavanhally et al.

(10) Patent No.: US 7,402,913 B2
(45) Date of Patent: Jul. 22, 2008

(54) HIGH DENSITY NANOSTRUCTURED INTERCONNECTION

(75) Inventors: Nagesh R Basavanhally, Skillman, NJ (US); Raymond A Cirelli, Hillsborough, NJ (US); Omar Daniel Lopez, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/852,413

(22) Filed: Sep. 10, 2007

(65) Prior Publication Data

US 2008/0001306 A1  Jan. 3, 2008

Related U.S. Application Data

(63) Continuation of application No. 10/816,527, filed on Apr. 1, 2004, now Pat. No. 7,327,037.

(51) Int. Cl.
*H01L 23/52* (2006.01)
(52) U.S. Cl. .................................................... 257/777
(58) Field of Classification Search ............... 257/777; 117/68
See application file for complete search history.

(56) References Cited

U.S. PATENT DOCUMENTS

| | | | |
|---|---|---|---|
| 6,185,961 B1 | 2/2001 | Tonucci et al. | |
| 6,297,063 B1 | 10/2001 | Brown et al. | |
| 6,340,822 B1 * | 1/2002 | Brown et al. | 257/25 |
| 6,383,923 B1 | 5/2002 | Brown et al. | |
| 6,407,922 B1 | 6/2002 | Eckblad et al. | |
| 6,828,685 B2 | 12/2004 | Stasiak | |
| 2002/0014667 A1 | 2/2002 | Shin et al. | |
| 2003/0175154 A1 | 9/2003 | Hsu et al. | |
| 2005/0066883 A1 | 3/2005 | Dubrow et al. | |
| 2005/0224975 A1 | 10/2005 | Basavanhally et al. | |

FOREIGN PATENT DOCUMENTS

| | | |
|---|---|---|
| EP | 1100297 A2 | 5/2001 |
| EP | 11320111 A1 | 6/2003 |
| WO | 02/099845 A2 | 12/2002 |

OTHER PUBLICATIONS

European Search Report, Application No. 05251771.1—2203 PCT/ dated Sep. 14, 2005.
Geim, A.K. et al.; "Microfabricated Adhesive Mimicking Gecko Foot-Hair"; Nature Materials, vol. 2; Jul. 2003/www.nature.com/naturematerials; pp. 461-463.
van der Walls; "Intermolecular Bonding—Van Der Walls Forces"; published on the internet at http://www.chemguide.co.uk/atoms/bonding/vdw.html; Mar. 2004; pp. 7.

* cited by examiner

*Primary Examiner*—Kiesha L Rose

(57) ABSTRACT

A method and apparatus for forming an electrically and/or thermally conducting interconnection is disclosed wherein a first surface and a second surface are contacted with each other via a plurality of nanostructures disposed on at least one of the surfaces. In one embodiment, a first plurality of areas of nanostructures is disposed on a component in an electronics package such as, illustratively, a microprocessor. The first plurality of areas is then brought into contact with a corresponding second plurality of areas of nanostructures on a substrate, thus creating a strong friction bond. In another illustrative embodiment, a plurality of nanostructures is disposed on a component, such as a microprocessor, which is then brought into contact with a substrate. Intermolecular forces result in an attraction between the molecules of the nanostructures and the molecules of the substrate, thus creating a bond between the nanostructures and the substrate.

5 Claims, 6 Drawing Sheets

HIGH DENSITY NANOSTRUCTURED INTERCONNECTION

CROSS-REFERENCE TO RELATED APPLICATIONS

This application is a continuation of U.S. application Ser. No. 10/816,527 filed on Apr. 1, 2004 now U.S. Pat. No. 7,327,037, entitled "HIGH DENSITY NANOSTRUCTURED INTERCONNECTION," commonly assigned with the present invention and incorporated herein by reference.

TECHNICAL FIELD OF THE INVENTION

The present invention relates generally to thermal and electrical interconnections and, more particularly, to nanostructured thermal and electrical interconnections.

BACKGROUND OF THE INVENTION

Methods for electrically or thermally connecting electronics components onto, for example, a conductor or semiconductor substrate are well known in the art. For example, both thermo-compression and solder bump bonding methods have been used to create connections between, illustratively, components in optoelectronic devices and/or microelectromechanical (MEMS) devices. FIG. 1 shows one illustrative method of forming a thermo-compression bond for use as a thermal or electrical interconnection. Specifically, in that figure, component 101 has a layer of a material 102, typically gold, which is suitable for compression bonding. In order to bond component 101 with illustrative substrate 105, layer 102 on component 101 is, for example, lowered in direction 104 in a way such that it is brought into contact with a layer 103 of material, once again illustratively gold, on substrate 105. A sufficient temperature (e.g., 300 degrees Celsius) and pressure (e.g., 10 kgf/mm$^2$ of gold area) are applied such that the gold layers deform and bond together. However, while such gold-gold thermo-compression bonding is useful in many regards, the temperatures and pressures required to create such a bond may damage sensitive electronic elements, such as transistors. As components become smaller and smaller, e.g., in MEMS devices, relatively high temperatures and pressures become more likely to cause damage to the increasingly fragile components.

FIG. 2 shows another illustrative prior method of thermally or electrically connecting two electronic components. Specifically, in that figure, substrate 200 is, for example, a surface of an electronics chip such as a microprocessor in a MEMS package. Solder bumps 201 are created on the chip using well-known methods. In order to create an electrical or thermal connection between the chip and a substrate, such as a printed wire board, the solder bumps are brought into contact with connection points and are then heated until they reflow. The bumps are then brought into contact with connection points on the exemplary printed wire board. Such solder bump methods are well-known as being very advantageous in forming electrical and thermal connections. However, once again, the temperature necessary to reflow the solder may damage MEMS components in the MEMS package. Additionally, solder bumps have been limited by certain design considerations. Specifically, such bumps must be above a certain size, typically larger than 20-25 microns in diameter, in order to achieve the desired bump height. Additionally, since it is undesirable to have solder bumps come into contact with one another when the solder is reflowed, solder bumps must typically be separated by a minimum distance, for example, 50 microns from the center of one bump to the center of an adjacent bump.

Finally, one other prior method for bonding two components together is to use a thermally and/or electrically conducting adhesive. However, such adhesives are typically subject to out-gassing as they cure which may introduce damaging organic material on critical electronics components that could interfere with proper performance of small components.

SUMMARY OF THE INVENTION

The present inventors have invented an apparatus and method for thermally and/or electrically connecting electronic components that substantially resolves the above problems with connections. Specifically, an electrically and/or thermally conducting interconnection is created wherein a first surface and a second surface are contacted with each other via a plurality of nanostructures disposed on at least one of said first surfaces and said second surfaces. In one embodiment, a first plurality of areas of nanostructures are disposed on a component in an electronics package such as, illustratively, a microprocessor. The first plurality of areas are then brought into contact with a corresponding second plurality of areas of nanostructures on a substrate. When brought into contact, the nanostructures in the first plurality of areas interleave with the nanostructures in the second plurality, thus creating a strong friction bond. When the nanostructures in the first and second pluralities are thermally conductive, a thermal interconnection is formed. When the nanostructures in the first and second pluralities are electrically conductive, an electrical interconnection is formed.

In another illustrative embodiment, a plurality of nanostructures is disposed on a component, such as a microprocessor, which is then brought into contact with a substrate. Intermolecular forces result in an attraction between the molecules of the nanostructures and the molecules of the substrate, thus creating a bond between the nanostructures and the substrate.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 3:
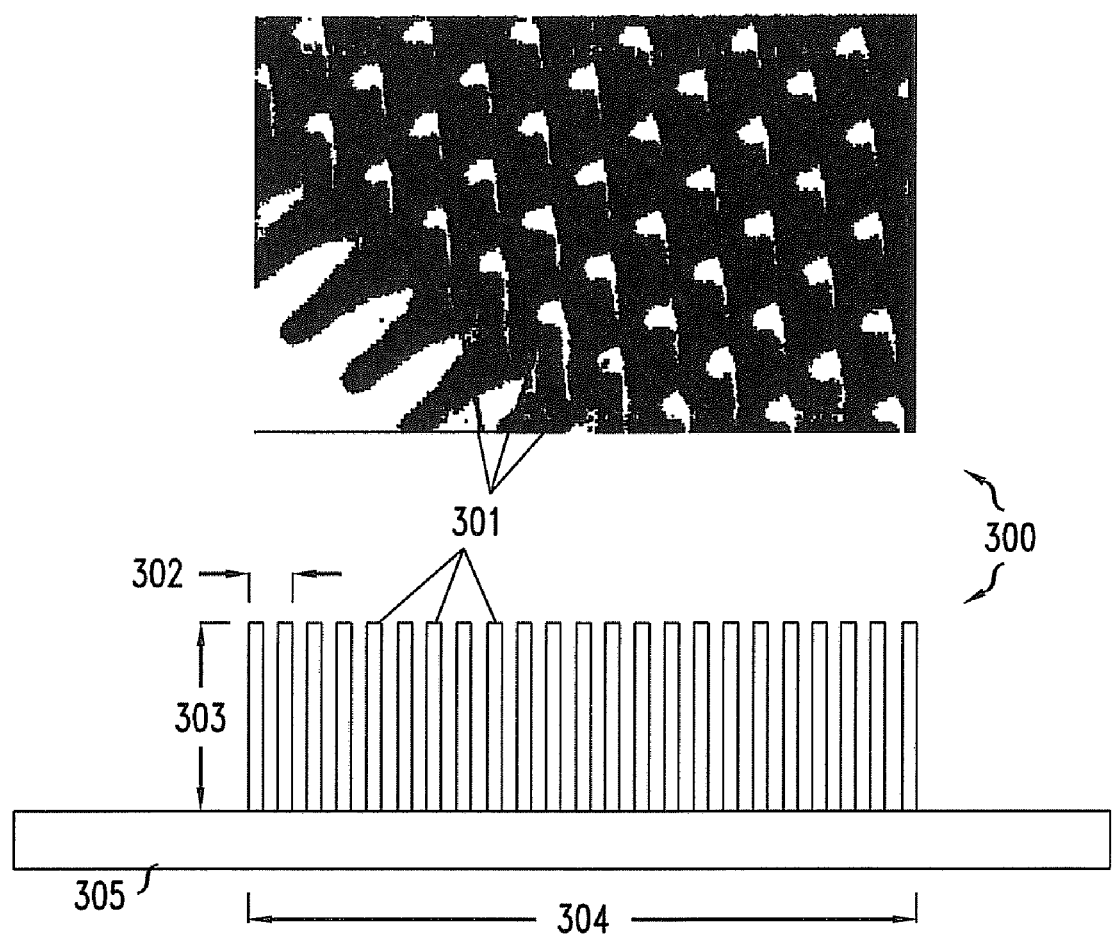
FIG. 3 shows an illustrative nanostructured surface in accordance with the principles of the present invention.

FIG. 3 shows one illustrative surface 300 in accordance with the principles of the present invention whereby a plurality of nanostructures 301, here nanoposts, are manufactured on a substrate 305, such as a silicon substrate. Cylindrical nanopost arrays, such as that shown in FIG. 3, have been produced with each nanopost having a diameter of less than 10 nm. One skilled in the art will recognize that there are many different illustrative arrangements (e.g., sizes, pitch and height) of nanoposts that can be produced using various methods and that such various diameter nanoposts can be fashioned with different degrees of regularity. An illustrative method of producing nanoposts, found in U.S. Pat. No. 6,185,961, titled "Nanopost arrays and process for making same," issued Feb. 13, 2001 to Tonucci, et al, is hereby incorporated by reference herein in its entirety. Nanoposts have been manufactured by various methods, such as by using a template to form the posts, by various means of lithography, and by various methods of etching.

As typically defined, a "nanostructure" is a predefined structure having at least one dimension of less than one micrometer and a "microstructure" is a predefined structure having at least one dimension of less than one millimeter. However, although the disclosed embodiments refer to nanostructures and nanostructured surfaces, it is intended by the present inventors, and will be clear to those skilled in the art, that microstructures may be substituted in many cases. Accordingly, the present inventors hereby define nanostructures to include both structures that have at least one dimension of less than one micrometer as well as those structures having at least one dimension less than one millimeter. The term "feature pattern" refers to either a pattern of microstructures or a pattern of nanostructures.

The nanoposts 301 of FIG. 3 are, for example, posts of a polymer material that is coated with a thin layer of gold or other material suitable for use as an electrical and/or thermal conductor. One skilled in the art will fully appreciate that many suitable materials may be selected to achieve the desired electrical and/or thermal conductivity of the nanoposts. Here, nanoposts 301 have, illustratively, a diameter of 200 nm and a height 303 of, for example, two micrometers. The nanoposts 301 are, for example, disposed in an area having a cross section width 304 (e.g., which is, illustratively, a circular diameter or a length of a side of a square area) of 10 micrometers. One skilled in the art will also recognize in light of the teachings herein that many suitable arrangements are equally advantageous.

Figure 4A:
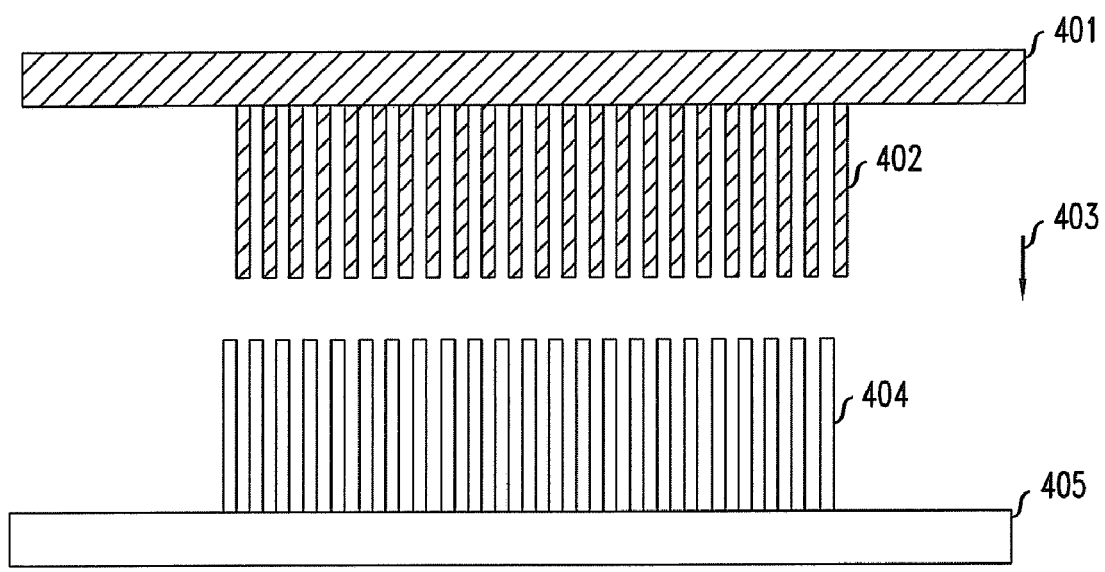
FIGS. 4A and 4B show one illustrative embodiment of how to create a compression bond using surfaces such as the illustrative surface of FIG. 3 in accordance with the principles of the present invention.
Figure 4B:
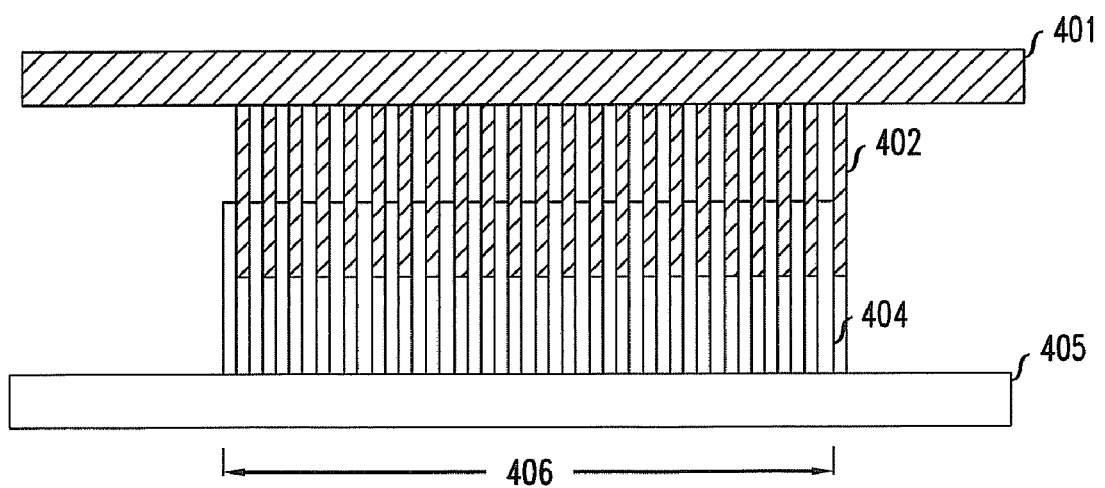

FIG. 4 shows one illustrative embodiment of an electrical or thermal interconnection created using the nanopost structure of FIG. 3. Specifically, referring to FIG. 4A, nanoposts 402 on surface 401, which is, illustratively, the surface of a microprocessor chip, are moved in direction 403 in a way such that they are brought into contact with the nanoposts 404 on surface 405. As can be seen in FIG. 4B, when the nanoposts 402 on surface 401 contact the nanoposts 404, the nanoposts on both surfaces will tend to interleave with each other. If the separation distance between the nanoposts, such as separation distance 302 in FIG. 3, is selected appropriately, all or a substantial number of the nanoposts 402 on surface 401 will contact one or more of the nanoposts 404 on surface 405. Accordingly, since nanoposts 402 and 404 are thermally and/or electrically conducting, a thermal or electrical interconnection is created by applying only minimal pressure at room or near-room temperature to cause the two nanostructured areas to contact each other. Thus, for example, in the case of an electrical connection, a signal can be passed from a circuit on surface 405 over the interconnection to a circuit on surface 401. Similarly, thermal energy can pass across the interconnection if the nanoposts of each surface are either manufactured or coated with a suitable thermally conductive material, such as the illustrative gold coating. Thus, for example, heat can be dissipated across the interconnection between the nanoposts of surface 401 and 405. The adhesion force resulting from the above-described contact is relatively high since a large surface area of the nanostructures on both surfaces are in contact with each other. Such a high adhesion force is a result of both the friction force resulting between the nanoposts as well as intermolecular forces, such as well-known Van Der Waals forces, between the molecules of the nanoposts on each of the surfaces. Thus, adhesive interconnections suitable for use in connecting electronics components in electronics packages are formed.

Figure 1:
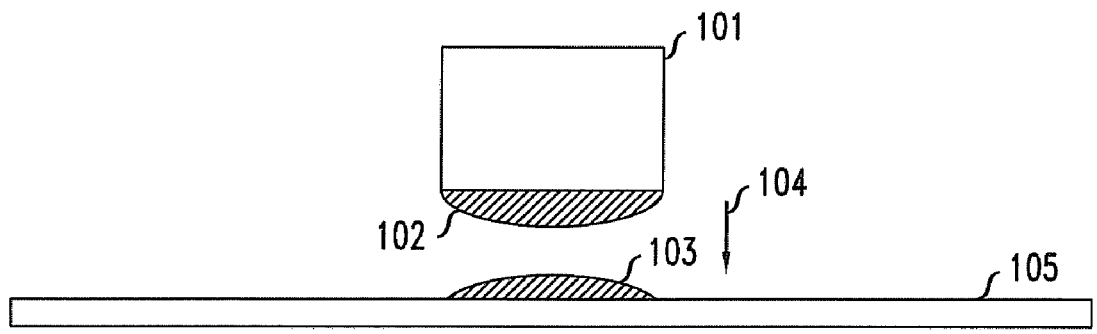
FIG. 1 shows a prior art method of forming a thermo-compression bond.
Figure 2:
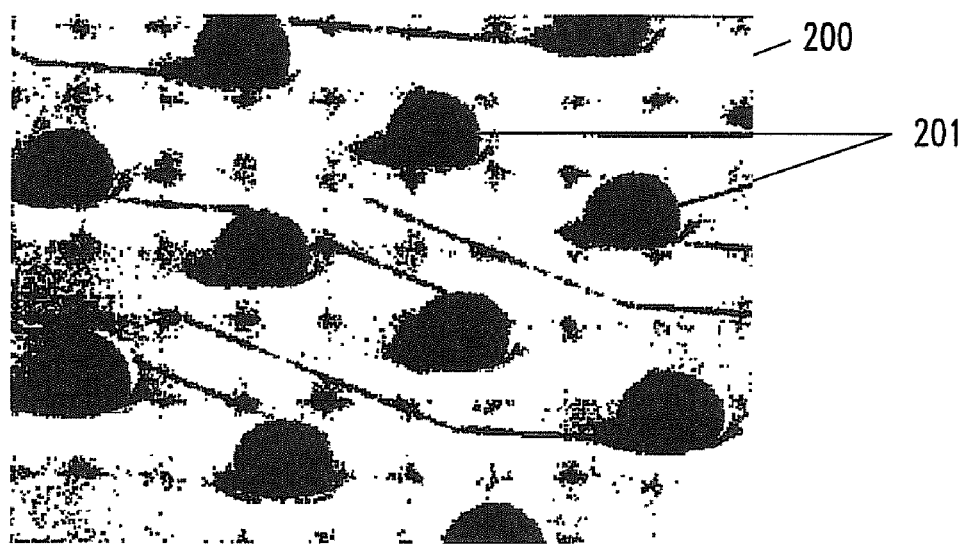
FIG. 2 shows a prior art electronics component having a plurality of solder bumps.
Figure 5:
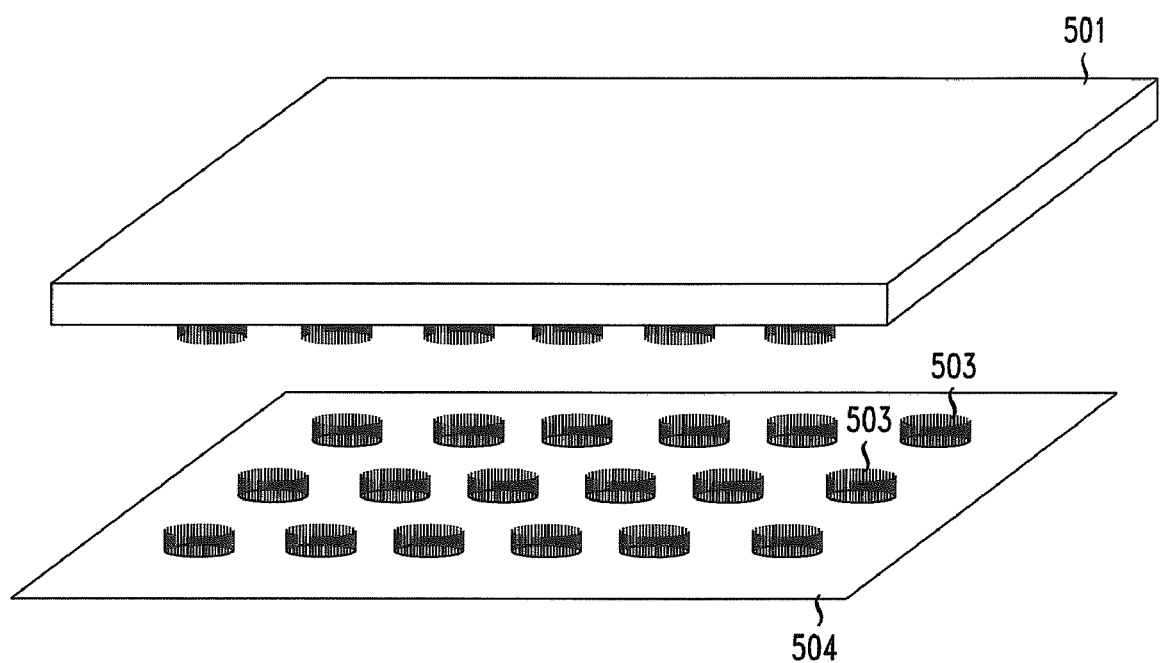
FIG. 5 shows how a plurality of interconnections, such as the interconnection of FIG. 4B, can be created between two components.

One skilled in the art will recognize that the interconnections described herein may be disposed on the surface of a component or substrate similar to the arrangement of solder bumps shown in FIG. 2. Specifically, small areas of nanoposts, can be disposed on the surface of a component such as a microprocessor in order to create electrical connections that function much as solder bump electrical connections. As shown in FIG. 5, multiple areas of nanoposts 502 can be disposed on a surface of a component 501 which is, once again, an illustrative microprocessor and can be brought into contact with corresponding areas of nanoposts 503 on surface 504 which is, illustratively, a surface of a printed wire board, in order to create the electrical interconnections necessary for microprocessor 501 to operate. Once again, the interconnections create a strong connecting force due to the friction and/or the intermolecular forces between the nanoposts on component 501 and surface 504.

While similar to the functionality of prior solder bump interconnections, the exemplary interconnections illustrated in FIG. 4B and FIG. 5 are advantageous in that they can be manufactured to a much smaller size than traditional solder bump connections. For example, as discussed above, the cross section width of one area of nanoposts can be, illustratively 10 microns and they can be separated by, for example, a pitch of 5 microns. Thus, for a given surface area of, for example, a microprocessor, a much greater density of nanostructures is possible can be achieved as compared to solder bump interconnections. Thus, for example, smaller components requiring smaller printed wire board space may be advantageously manufactured using nanostructured interconnections in accordance with the principles of the present invention.

Figure 6A:
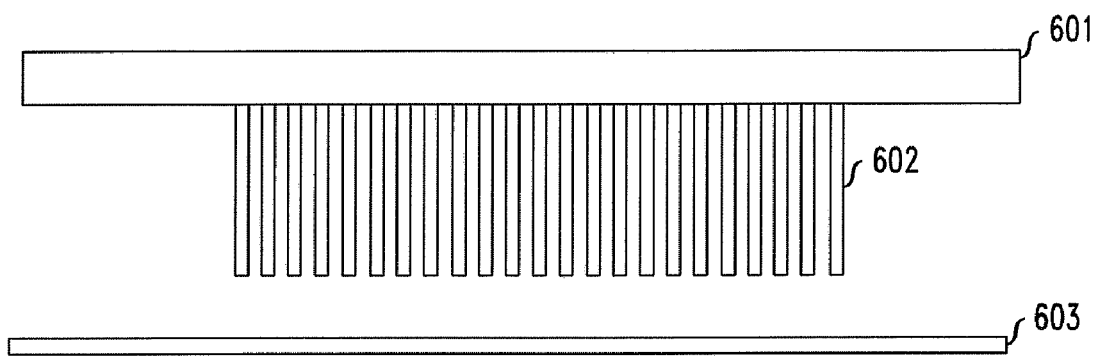
FIGS. 6A and 6B show one illustrative embodiment of how to create a bond using intermolecular forces to join the surface of FIG. 3 to a substrate.
Figure 6B:
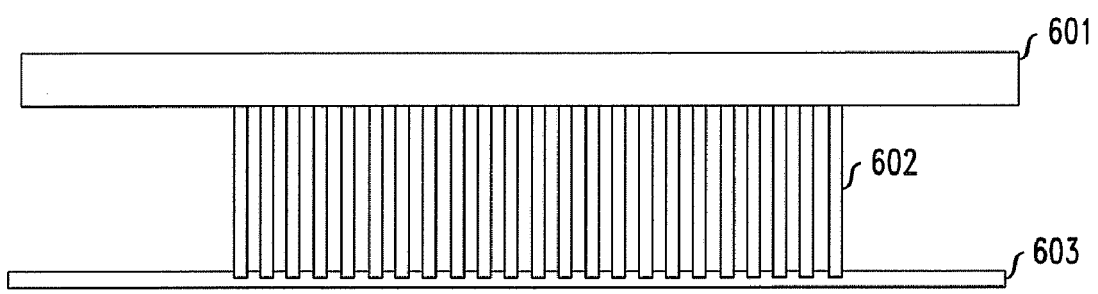

FIGS. 6A and 6B show another illustrative use of a thermal or electrical connection possible with the use of a nanostructured surface similar to the nanostructured surface of FIG. 3. As discussed previously, typical prior methods of forming thermally or electrically conductive connections between electronics components such as chips and substrates required soldering or using conducting adhesives which, as also discussed above, can be disadvantageous in small devices such as MEMS devices. Therefore, referring to FIG. 6A, the present inventors have invented a method of creating a thermal or electrical connection between component 601, which once again is an illustrative microprocessor, and surface 603, which is, illustratively, a surface of a thermally conductive metal foil, such as aluminum foil. One skilled in the art will recognize that, to achieve an electrically conductive connection, a suitable electrically conductive material would be used for both the nanoposts 602 and the substrate 603.

In this illustrative example, in order to form a thermally conductive interconnection, nanoposts 602 are, in the illustrative embodiments of FIGS. 6A and 6B, manufactured of a polyimide material, such as pyromellitic dianhydride-oxydianiline polyimide material. One skilled in the art will recognize that many other well-known polyimide materials may be used in accordance with the principles of the present invention to achieve advantageous nanoposts. Methods of manufacturing and use of nanostructured or microstructured surfaces suitable for use in accordance with the principles of the present invention are described generally in the article authored by A. K. Geim et. al, entitled "Microfabricated Adhesive Mimicking Gecko Foot-Hair," Nature Materials, Volume 2, July 2003, p. 461-463 ("Geim article"), which is hereby incorporated by reference herein in its entirety. As described in this article, when a nanostructured surface, such as surface 601 having nanostructures 602 in FIG. 6A, is brought into contact with a suitable substrate such as the illustrative thermally conducting surface 603, it is possible to achieve a relatively strong attachment between the nanostructures and the substrate. This connection, illustrated in FIG. 6B, is cause by capillary and intermolecular attractions between the molecules of the nanostructures 602 and the molecules of the illustrative substrate 603. Specifically, such a connection is created by selecting an appropriate nanostructure diameter, density and pitch, to generate a desired attractive force due to the collective molecular attraction of the nanostructures 601 to the substrate. A connection created by this method is, for example, capable of creating an attractive force of, for example, 3 N/cm² area of nanostructures. Intermolecular attractions are known in the art and are generally described in the article "Intermolecular Bonding—Van Der Waals Forces" published on the Internet at http://www.chemguide.co.uk/atoms/bonding/vdw.html on or before Mar. 25, 2004 and which is hereby incorporated by reference herein in its entirety.

Figure 7:
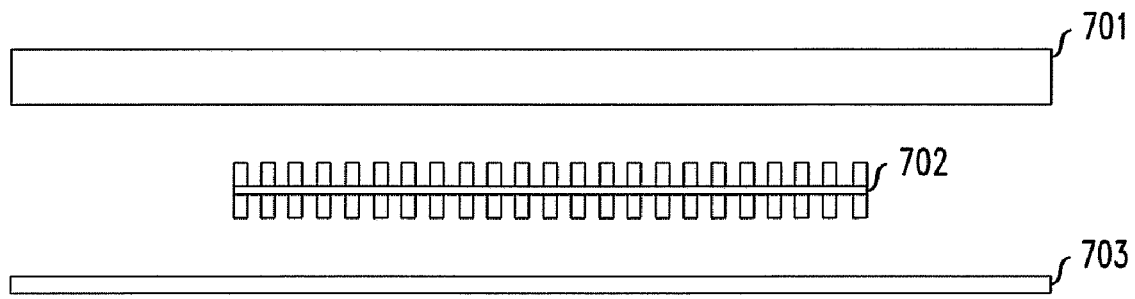
FIG. 7 shows another illustrative embodiment of a bond created using intermolecular forces.

Referring once again to FIG. 6B, a flexible foil substrate 603, of an illustrative thickness between approximately 25 and 50 micrometers thick, is used in order to allow the nanostructures to conform to the uneven nature of the substrate which, as discussed in the Geim article, enhances the attractive force between the nanostructures and the substrate. Thus, by using a suitable thermally or electrically conducting material for the nanoposts 602 and the substrate 605 in FIG. 6B, a relatively strong interconnection is created. One skilled in the art will recognize that, instead of disposing nanostructures directly on component 601 in FIGS. 6A and 6B, other arrangements are possible. For example, as shown in FIG. 7, an intermediate layer 702 of nanostructures may be disposed between component 701 and substrate 703. In such an arrangement, nanostructures may be manufactured on both sides of the intermediate layer 702 and then may be brought into contact with both component 701 as well as substrate 703 in a way such that intermolecular forces bond the component and the substrate to the nanostructures. The teachings of the embodiments disclosed here are intended to encompass all methods of using nanostructures to create a thermal or electrical interconnection.

The foregoing merely illustrates the principles of the invention. It will thus be appreciated that those skilled in the art will be able to devise various arrangements which, although not explicitly described or shown herein, embody the principles of the invention and are within its spirit and scope. For example, one skilled in the art, in light of the descriptions of the various embodiments herein, will recognize that the principles of the present invention may be utilized in widely disparate fields and applications. One skilled in the art will be able to devise many similar uses of the underlying principles associated with the present invention, all of which are intended to be encompassed herein. For example, while friction and intermolecular attractive forces are illustratively shown in the embodiments herein, one skilled in the art will recognize that may different attractive forces, such electromagnetic, ionic and/or quantum forces may be useful in creating and maintaining an interconnection between nanostructures and surfaces, whether or not those surfaces also have nanostructures.

All examples and conditional language recited herein are intended expressly to be only for pedagogical purposes to aid the reader in understanding the principles of the invention and are to be construed as being without limitation to such specifically recited examples and conditions. Moreover, all statements herein reciting aspects and embodiments of the invention, as well as specific examples thereof, are intended to encompass functional equivalents thereof.

What is claimed is:

1. An interconnection comprising:
a first surface;
a second surface;
a first plurality of conductive nanostructures disposed on said first surface;
a second plurality of conductive nanostructures disposed on said second surface,
wherein said first plurality of nanostructures and said second plurality of nanostructures are configured to interleave with one another and adapted to transfer thermal or electrical energy from said first plurality of nanostructures to said second plurality of nanostructures, and further wherein said first plurality of nanostructures and said second plurality of nanostructures adhere to one another using attractive forces with sufficient force to hold the first and second surfaces in contact with one another.

2. The interconnect as recited in claim 1 wherein the attractive forces are intermolecular or capillary attractive forces.

3. An interconnection for use with electrical components comprising:
a first surface;
a second surface;
a first plurality of nanostructures disposed on one side of an intermediate layer and a second plurality of nanostructure disposed on an opposing side of said intermediate layer, said intermediate layer configured to be positioned between said first surface and said second surface such that said first plurality of nanostructures adhere to said first surface and said second plurality of nanostructures adhere to said second surface, wherein said first plurality of nanostructures adhere to said first surface using attractive forces and said second plurality of nanostructures adhere to said second surface using attractive forces.

4. The interconnect as recited in claim 3 wherein said first plurality of nanostructures and said second plurality of nanostructures form a conductive connection between said first surface and said second surface.

5. The interconnect as recited in claim 3 wherein the attractive forces are intermolecular or capillary attractive forces.

* * * * *